(12) United States Patent  
Adams et al.

(10) Patent No.: US 7,480,170 B1
(45) Date of Patent: Jan. 20, 2009

(54) METHOD AND APPARATUS FOR IMPLEMENTING ENHANCED SRAM READ PERFORMANCE SORT RING OSCILLATOR (PSRO)

(75) Inventors: Chad Allen Adams, Byron, MN (US); Todd Alan Christensen, Rochester, MN (US); Travis Reynold Hebig, Rochester, MN (US); Kirk David Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/782,808

(22) Filed: Jul. 25, 2007

(51) Int. Cl.
*G11C 11/40* (2006.01)
(52) U.S. Cl. .................................. 365/154; 365/190
(58) Field of Classification Search .............. 365/155, 365/156
See application file for complete search history.

(56) References Cited

U.S. PATENT DOCUMENTS

| 5,040,146 | A | * | 8/1991 | Mattausch et al. | 365/154 |
| 5,289,432 | A | * | 2/1994 | Dhong et al. | 365/230.05 |
| 5,973,985 | A | * | 10/1999 | Ferrant | 365/230.05 |

* cited by examiner

Primary Examiner—Tan T. Nguyen
(74) Attorney, Agent, or Firm—Joan Pennington (57) ABSTRACT

A method and apparatus including a static random access memory (SRAM) cell implement an enhanced SRAM read performance sort ring oscillator (PSRO). A pair of parallel reverse polarity connected inverters defines a static latch or cross-coupled memory cell. The SRAM cell includes independent left and right wordlines providing a respective gate input to a pair of access transistors used to access to the memory cell. The SRAM cell includes a voltage supply connection to one side of the static latch. For example, a complement side of the static latch is connected to the voltage supply. A plurality of the SRAM cells is assembled together to form a SRAM base block. A plurality of the SRAM base blocks is connected together to form the SRAM read PSRO.

20 Claims, 6 Drawing Sheets

PRIOR ART
(CONVENTIONAL 6T SRAM CELL)

FIG. 1

200
(MODIFIED 6T SRAM CELL FOR IMPLEMENTING PERFORMANCE SORT RING OSCILLATOR)

METHOD AND APPARATUS FOR IMPLEMENTING ENHANCED SRAM READ PERFORMANCE SORT RING OSCILLATOR (PSRO)

FIELD OF THE INVENTION

The present invention relates generally to the data processing field, and more particularly, relates to a method and apparatus for implementing an enhanced SRAM read performance sort ring oscillator (PSRO).

DESCRIPTION OF THE RELATED ART

In advanced CMOS technologies it is becoming common practice for the six-transistor (6T) static random access memory (SRAM) cells to have unique threshold voltage Vt implants independent from standard logic devices. This causes the 6T SRAMs to loose tracking to the standard logic with conventional SRAM performance sort ring oscillators (PSROs) used as performance monitors or on-device wafer monitors for manufacturing line tuning.

Figure 1:
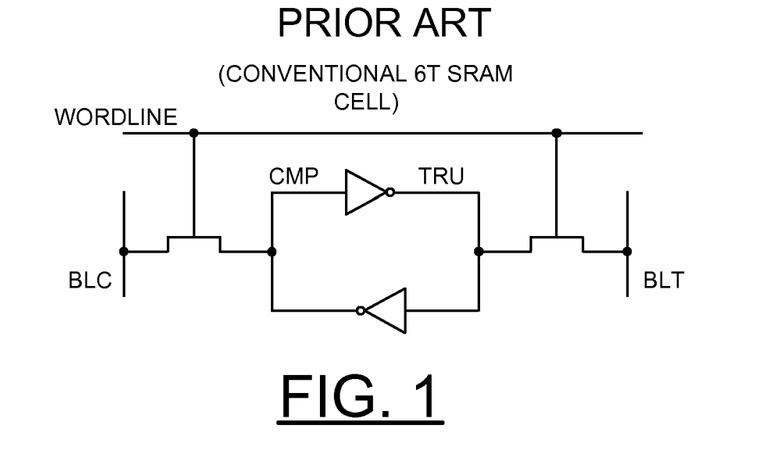
FIG. 1 illustrates a conventional six-transistor (6T) static random access memory (SRAM) cell.

FIG. 1 illustrates a conventional six-transistor (6T) static random access memory (SRAM) cell. The prior art 6T SRAM cell includes four transistors defining a pair of parallel reverse polarity connected inverters for storing data and a pair of N-channel field effect transistors (NFETs) receiving a gate input WORDLINE that is activated, turning on respective NFETs to perform a read or write operation.

A need exists for an effective method and apparatus for implementing an enhanced SRAM read performance sort ring oscillator (PSRO).

SUMMARY OF THE INVENTION

Principal aspects of the present invention are to provide a method and apparatus for implementing enhanced SRAM read performance sort ring oscillator (PSRO). Other important aspects of the present invention are to provide such a method and apparatus for implementing enhanced SRAM read PSRO substantially without negative effect and that overcome many of the disadvantages of prior art arrangements.

In brief, a method and a static random access memory (SRAM) cell are provided for implementing an enhanced SRAM read performance sort ring oscillator (PSRO). A pair of parallel reverse polarity connected inverters defines a static latch or cross-coupled memory cell. The SRAM cell includes independent left and right wordlines providing a respective gate input to a pair of access transistors used to obtain access to the memory cell. The pair of access transistors is respectively connected between a true side of the static latch and a true bitline input, and a complement side of the static latch and a complement bitline input. The SRAM cell includes a voltage supply connection to one side of the static latch. For example, the complement side of the static latch is connected to the voltage supply. A plurality of the SRAM cells is assembled together to form a SRAM base block. A plurality of the SRAM base blocks is connected together to form the SRAM read PSRO.

In accordance with features of the invention, a SRAM base block includes a first column of a plurality of the SRAM cells coupled to first true and complement bitlines and a second column of a plurality of the SRAM cells coupled to second true and complement bitlines. The first column of the SRAM cells receives a left wordline input and the second column of the SRAM cells receives a right wordline input. An internal wordline node between the first and second column of the SRAM cells provides a right wordline input to the first column of the SRAM cells and a left wordline input to the second column of the SRAM cells.

In accordance with features of the invention, the SRAM base block includes a first local evaluation circuit coupled to the first true and complement bitlines and provides an input of a first NAND gate having a second input connected to the first true bitline. A first precharge transistor is connected between a voltage supply and the first true bitline having a gate input connection to the internal wordline node. The first NAND gate provides an output of the first column SRAM cells of the SRAM base block. A second local evaluation circuit is coupled to the second true and complement bit lines and provides an input of a second NAND gate having a second input connected to the second true bitline. A second precharge transistor connected between a voltage supply and the second true bitline has a gate input connection to the right wordline input. The second NAND gate provides an output of the SRAM base block.

In accordance with features of the invention, the SRAM base block includes a third NAND gate receiving a wordline input and a reset signal input and having an output applied by an inverter to the internal wordline node. The SRAM base block includes a fourth NAND gate having an input of the output of the first NAND gate and the reset signal input and having an output applied by an inverter to the right wordline input.

In accordance with features of the invention, the SRAM read PSRO includes the plurality of the SRAM base blocks connected in a chain. A reset signal is applied in parallel to each of the plurality of the SRAM base blocks so that the period of the ring oscillator output signal is a function of many series read operation but only a single precharge time. An inverted feedback output is combined with a control signal to stop and start the ring operation. A plurality of inverters is included in a ring output path to expand the pulse width of the ring oscillator output signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2:
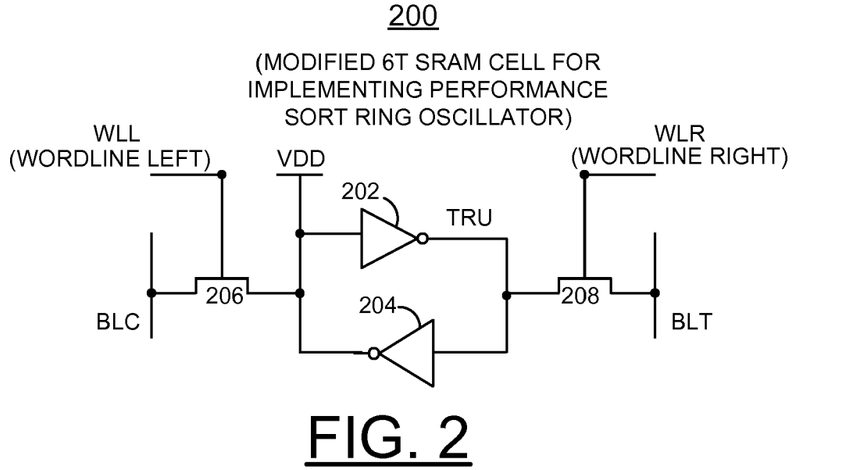
FIG. 2 illustrates a modified six-transistor (6T) static random access memory (SRAM) cell for implementing a performance sort ring oscillator (PSRO) in accordance with the preferred embodiment.

Having reference now to the drawings, in FIG. 2, there is shown a modified six-transistor (6T) static random access memory (SRAM) cell generally designated by the reference character 200 for implementing a SRAM read performance sort ring oscillator (PSRO) in accordance with the preferred embodiment.

SRAM cell 200 includes a static latch or cross-coupled memory cell defined by a pair of parallel reverse-connected inverters 202, 204 for storing data and a pair of N-channel field effect transistors (NFETs) 206, 208 respectively connected to a respective side of the static latch and a respective one of bit line pair BLC, BLT. The inverters 202, 204 defining the static latch include four transistors (not shown).

SRAM cell 200 of the preferred embodiment includes independent left and right wordlines WLL (WORDLINE LEFT), WLR (WORDLINE RIGHT) providing a respective gate input to the access transistors 206, 208 used to obtain access to the memory cell. The pair of access NFETs 206, 208 is connected between a respective first side or complement side of the static latch and a complement bitline input BLC and a second side or true side of the static latch of the parallel reverse-connected inverters 202, 204 and a true bit line BLT. NFETs 206, 208 receive a respective gate input WLL (WORDLINE LEFT), WLR (WORDLINE RIGHT) that is activated, turning on the respective NFETs 206, 208.

In accordance with features of the invention, SRAM cell 200 includes a connection of voltage supply VDD to one side of the static latch defined by inverter 202, 204. For example, the complement side of the static latch is connected to the voltage supply, as shown in FIG. 2. With this modification to tie one side of the cell to VDD, no initialization of the SRAM cell 200 is required.

Figure 3:
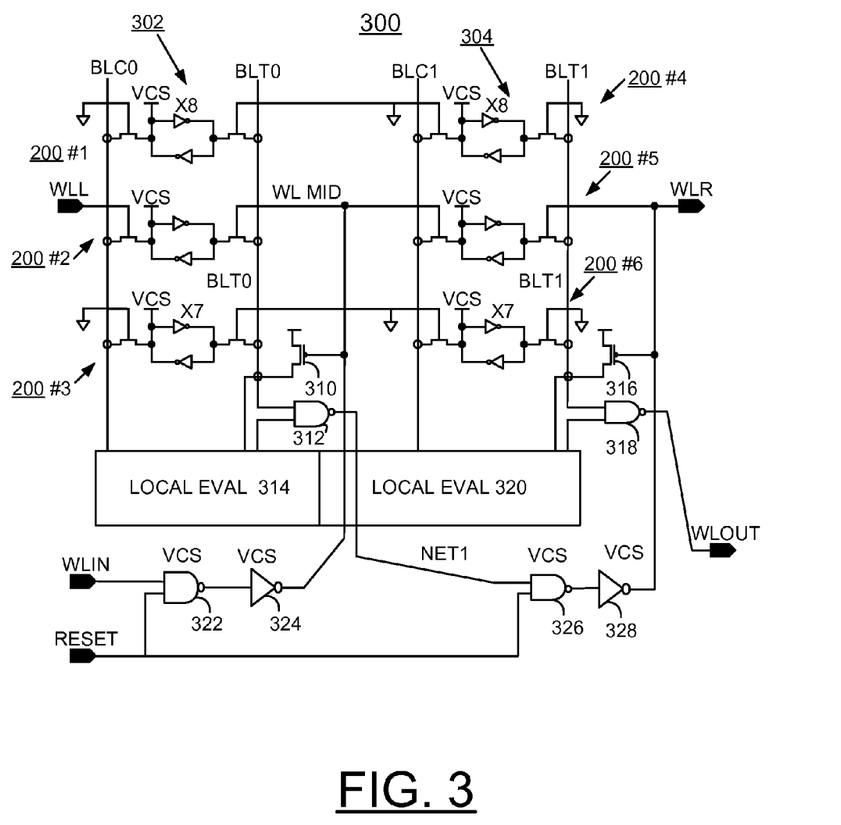
FIG. 3 illustrates an exemplary SRAM base block used for implementing a performance sort ring oscillator (PSRO) in accordance with the preferred embodiment.

In accordance with features of the invention, a plurality of the SRAM cells are assembled together with a domino read circuit to define a SRAM base block, as illustrated in FIG. 3. A plurality of the SRAM base blocks is connected together to form the SRAM read PSRO, as illustrated and described with respect to FIGS. 4 and 5.

FIG. 3 illustrates an exemplary SRAM base block generally designated by the reference character 300 used for implementing a performance sort ring oscillator (PSRO) in accordance with the preferred embodiment.

SRAM base block 300 includes a first column generally designated by 302 of a plurality of the SRAM cells 200, #1-3 coupled to first true and complement bitlines BLT0, BLC0 and a second column generally designated by 304 of a plurality of the SRAM cells 200, #4-6 coupled to second true and complement bitlines BLT1, BLC1. The first column 302 of the SRAM cells receives a left wordline input WLL applied to SRAM cell 200, #2 and the second column 304 of the SRAM cells receives a right wordline input WLR applied to SRAM cell 200, #5. An internal wordline node WL MID between the first and second columns 302, 304 of the SRAM cells 200 provides a right wordline input applied to SRAM cell 200, #2 of the first column 302 of the SRAM cells 200 and a left wordline input applied to SRAM cell 200, #5 the second column 304 of the SRAM cells 200.

As shown, the first column 302 of the SRAM cells 200 and the second column 304 of the SRAM cells 200 respectively includes one active SRAM cell 200, #2, and SRAM cell 200, #5. The remaining SRAM cells 200, #1, 3, SRAM cells 200, #4, 6 include a gate input of the access NFETs tied to ground, and are provided to model bitline capacitance in the SRAM base block 300.

While three SRAM cells 200, #1-3, SRAM cells 200, #4-6 are shown, it should be understood that the invention is not limited to this illustrated arrangement. True and complement bit lines of the SRAM cells are continuous across a local SRAM cell group including a predefined number of SRAM cells 200, for example sixteen (16) SRAM cells.

SRAM base block 300 includes a first precharge transistor 310 connected between a voltage supply and the first true bitline BLT0 having a gate input connection to the internal wordline node WL MID for precharging the first true bitline BLT0 with a low gate input WL MID. SRAM base block includes a first NAND gate 312 having an input connected to the first true bitline BLT0. SRAM base block 300 includes a first local evaluation circuit 314 coupled to the first true and complement bitlines and provides a second input of the first NAND gate 312. The first NAND gate 312 provides an output of the first column 302 of SRAM cells 300 of the SRAM base block 300.

SRAM base block 300 includes a second precharge transistor 316 connected between a voltage supply and the first true bitline BLT1 having a gate input connection to the right wordline node WLR for precharging the second true bitline BLT1 with a low gate input WLR. SRAM base block 300 includes a second NAND gate 318 having an input connected to the second true bitline BLT1. SRAM base block 300 includes a second local evaluation circuit 320 coupled to the second true and complement bitlines BLT1, BLC1 and provides a second input of the second NAND gate 318. The second NAND gate 318 provides an output WLOUT of the SRAM base block 300.

In accordance with features of the invention, the SRAM base block includes a third NAND gate receiving a wordline input and a reset signal input and having an output applied by an inverter to the internal wordline node. The SRAM base block includes a fourth NAND gate having an input of the output of the first NAND gate and the reset signal input and having an output applied by an inverter to the right wordline input.

SRAM base block 300 includes a third NAND gate 322 receiving a wordline input WLIN and a reset signal input RESET and having an output applied by an inverter 324 to the internal wordline node WL MID. The SRAM base block 300 includes a fourth NAND gate 326 having an input of the output of the first NAND gate 312 indicated at NET1 and the reset signal input RESET and having an output applied by an inverter 328 to the right wordline input WLR. The NAND gates 322, 326 and inverters 324, 328 model wordline driver delay in SRAM base block 300. SRAM base block 300 shows the NAND gates 322, 236 and inverters 324, 328 driven to an optional higher voltage supply VCS; however, for chips with only a single voltage supply this would be VDD.

Operation of SRAM base block 300 may be understood as follows. The RESET signal starts high with WLIN low. For the base building block 300, signal WLL can be ignored. While RESET is still high when WLIN goes high, WLMID will also goes high and this will cause net BLT0, the read bitline, to go low. When BLT0 goes low, this causes NET1 to go high and the same operation is repeated in the second column 304 of SRAM cells 200, causing WLOUT to go high. The RESET signal comes into play with multiple base blocks 300 tiled together from left to right to form a performance sort ring oscillator (PSRO), as illustrated in FIGS. 4 and 5, and is feedback inverted to reset all the read bitlines in parallel as illustrated exemplary waveforms of FIG. 7.

Figure 4:
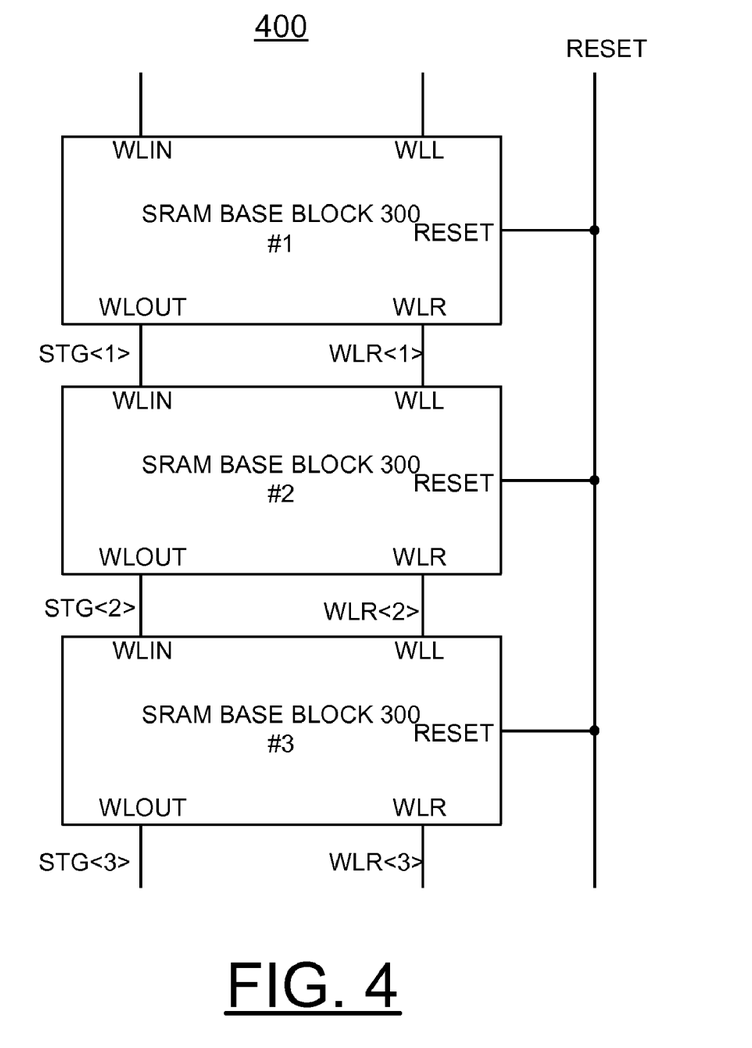
FIG. 4 illustrates an exemplary tiling arrangement of the SRAM blocks for implementing a performance sort ring oscillator (PSRO) in accordance with the preferred embodiment.
Figure 5:
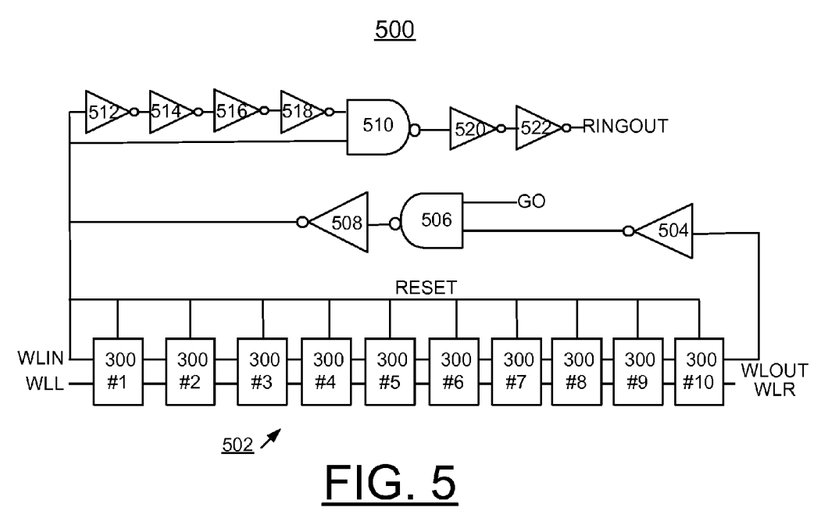
FIG. 5 illustrates an exemplary SRAM read performance sort ring oscillator (PSRO) in accordance with the preferred embodiment.

FIG. 4 illustrates a tiling arrangement generally designated by the reference character 400 of the SRAM blocks 300 for implementing a performance sort ring oscillator (PSRO) in accordance with the preferred embodiment. A SRAM blocks 300 are tiled together as shown in FIG. 4 to implement an exemplary SRAM read performance sort ring oscillator (PSRO) as illustrated and described with respect to FIG. 5.

A reset signal RESET is applied in parallel to all the SRAM blocks 300. An output WLOUT of a first SRAM base block 300, #1 is connected to the WLIN input of a next SRAM base block 300, #2, as indicated at a line STG<1>. The right wordline input WLR of the first SRAM base block 300, #1 is connected to the left wordline input WLL input of a next SRAM base block 300, #2, as indicated at a line WRL<1>.

The output WLOUT of the next SRAM base block 300, #2 is connected to the WLIN input of a next SRAM base block 300, #3, as indicated at a line STG<2>. The right wordline input WLR of the first SRAM base block 300, #2 is connected to the left wordline input WLL input of a next SRAM base block 300, #3, as indicated at a line WRL<2>. This tiling connection arrangement 400 is continued for all the SRAM blocks 300 in a chain forming a SRAM read PSRO.

FIG. 5 illustrates an exemplary SRAM read performance sort ring oscillator (PSRO) generally designated by the reference character 500 in accordance with the preferred embodiment.

SRAM read PSRO 500 includes a chain 502 of a plurality of SRAM base blocks 300, #1-10 connected together as illustrated in more detail in FIG. 4. The RESET signal is brought into all SRAM base blocks 300, #1-10 in parallel.

The RESET signal is applied in parallel to each of the plurality of the SRAM base blocks 300 so that the period of the ring oscillator output signal RINGOUT is a function of many series read operation but only a single precharge time.

As shown, the wordline input WLIN is applied to the first SRAM base block 300, #1 and the output WLOUT of the SRAM base block 300, #10 provides a feedback signal applied to an inverter 504 providing an inverted feedback signal applied to a NAND gate 506. The inverted feedback signal is combined with a control signal GO by NAND gate 506. The NAND gate 506 is used to stop and start the ring operation. The output of NAND gate 506 is applied to an inverter 508 providing an inverted controlled feedback signal applied to a NAND gate 510. A plurality of inverters 512, 514, 516, 518 is included in a ring output path to a second input to NAND gate 510 to expand the pulse width of the ring oscillator output signal RINGOUT. A final pair of inverters 522, 522 is connected to the output of NAND gate 510 for providing the ring oscillator output signal RINGOUT.

Figure 6:
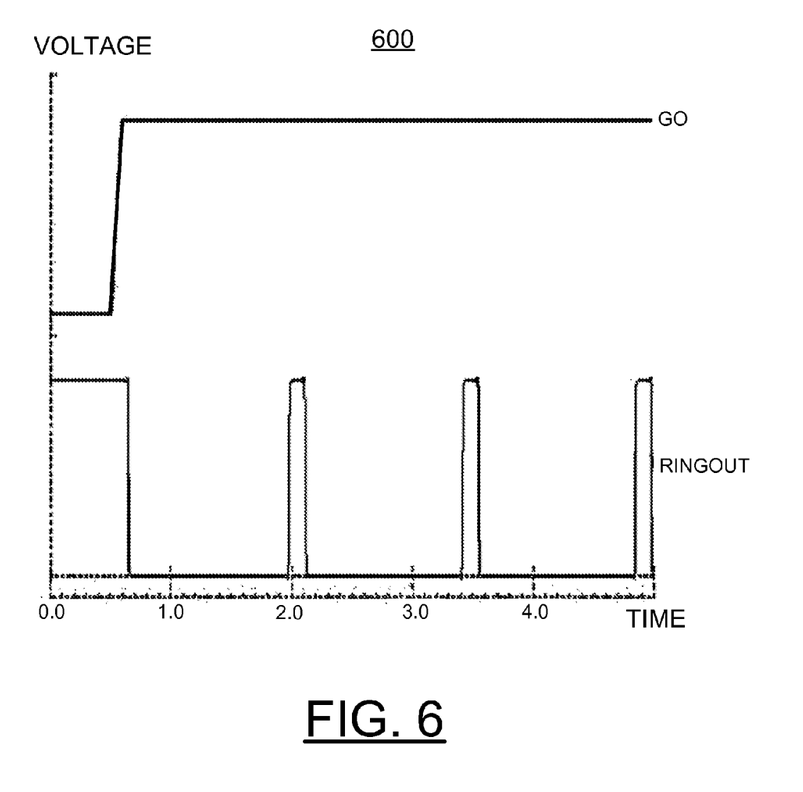
FIGS. 6, and 7 are charts illustrating operation of the exemplary SRAM read performance sort ring oscillator (PSRO) of FIG. 5 in accordance with the preferred embodiment.

FIG. 6 illustrates overall operation generally designated by the reference character 600 of the exemplary SRAM read PSRO 500 in accordance with the preferred embodiment. The control signal GO is shown going from low to high allowing ring operation of the SRAM read PSRO 500, illustrated by the line labeled RINGOUT. The ring output signal RINGOUT produces a series of repeated pulses where the period is determined by the combination of the series read and single reset operation per pulse.

Figure 7:
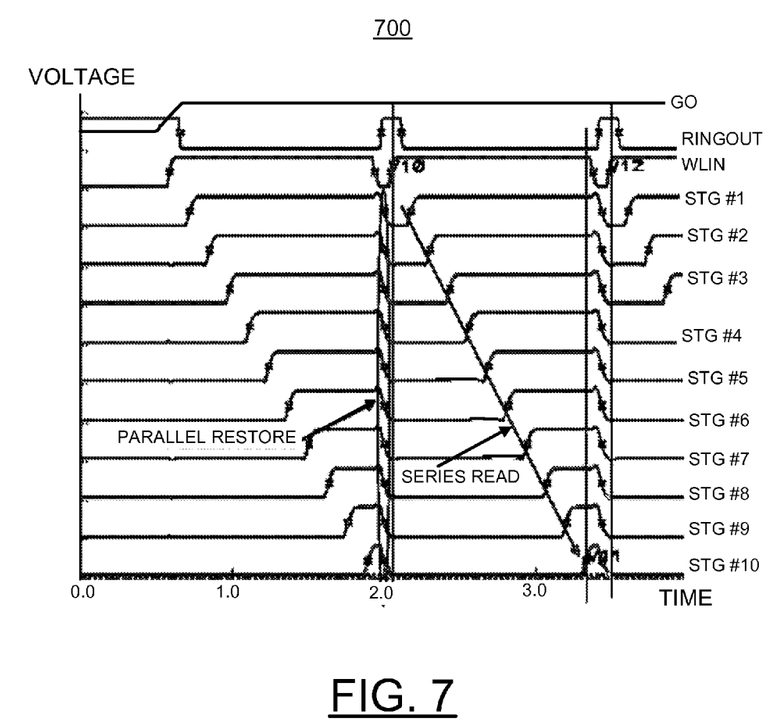

FIG. 7 illustrates internal operation generally designated by the reference character 700 of the exemplary SRAM read PSRO 500 in accordance with the preferred embodiment. FIG. 7 illustrates exemplary illustrated waveforms WLOUT coupled between the base building blocks 300 and labeled STG #1-#10 with an input waveform WLIN applied to the first block 300, #1. FIG. 7 illustrates how the restore done in parallel with each RINGOUT pulse and labeled PARALLEL RESTORE and the following series nature of the read labeled SERIES READ.

While the present invention has been described with reference to the details of the embodiments of the invention shown in the drawing, these details are not intended to limit the scope of the invention as claimed in the appended claims.

What is claimed is:

1. A static random access memory (SRAM) cell for implementing a SRAM read performance sort ring oscillator (PSRO) comprising:
    a static latch defined by a pair of parallel reverse polarity connected inverters;
    a pair of access transistors; said pair of access transistors respectively connected between a true side of the static latch and a true bitline input, and a complement side of the static latch and a complement bitline input;
    independent left and right wordlines providing a respective gate input to said pair of access transistors;
    one side of the static latch, where the access transistor is coupled to, being connected to voltage supply;
    a plurality of the SRAM cells being assembled together to define a SRAM base block; and
    a plurality of said SRAM base blocks being connected together to form the SRAM read PSRO.

2. The SRAM cell for implementing a SRAM read PSRO as recited in claim 1 wherein said SRAM base block includes a first column of a plurality of said SRAM cells coupled to first true and complement bitlines.

3. The SRAM cell for implementing a SRAM read PSRO as recited in claim 2 wherein said SRAM base block includes a second column of a plurality of said SRAM cells coupled to second true and complement bitlines.

4. The SRAM cell for implementing a SRAM read PSRO as recited in claim 3 wherein said first column of said SRAM cells receives a left wordline input and said second column of said SRAM cells receives a right wordline input.

5. The SRAM cell for implementing a SRAM read PSRO as recited in claim 4 wherein said SRAM base block includes an internal wordline node between said first and second column of said SRAM cells, said internal wordline node provides a right wordline input to said first column of said SRAM cells and a left wordline input to said second column of said SRAM cells.

6. The SRAM cell for implementing a SRAM read PSRO as recited in claim 5 wherein said SRAM base block includes a first local evaluation circuit coupled to said first true and complement bitlines, and a second local evaluation circuit coupled to said second true and complement bit lines.

7. The SRAM cell for implementing a SRAM read PSRO as recited in claim 6 wherein said SRAM base block includes a first NAND gate coupled to said first local evaluation circuit and having an input connected to said first true bitline, and said first NAND gate provides an output of the first column SRAM cells of the SRAM base block.

8. The SRAM cell for implementing a SRAM read PSRO as recited in claim 6 wherein said SRAM base block includes a second NAND gate coupled to said second local evaluation circuit and having an input connected to said second true bitline, and said second NAND gate provides an output of said second column SRAM cells and said SRAM base block.

9. The SRAM cell for implementing a SRAM read PSRO as recited in claim 6 wherein said SRAM base block includes a first precharge transistor connected between a voltage supply and said first true bitline having a gate input connection to said internal wordline node; and a second precharge transistor connected between said voltage supply and said second true bitline having a gate input connection to said right wordline input.

10. The SRAM cell for implementing a SRAM read PSRO as recited in claim 6 wherein said SRAM base block includes a third NAND gate receiving a wordline input and a reset signal input and having an output applied by an inverter to said internal wordline node.

11. The SRAM cell for implementing a SRAM read PSRO as recited in claim 10 wherein said SRAM base block includes a fourth NAND gate having an input of said output of said first NAND gate and said reset signal input and having an output applied by an inverter to said right wordline input.

12. The SRAM cell for implementing a SRAM read PSRO as recited in claim 1 wherein said SRAM read PSRO includes said plurality of said SRAM base blocks connected in a chain.

13. The SRAM cell for implementing a SRAM read PSRO as recited in claim 1 wherein said SRAM read PSRO includes a reset signal; said reset signal applied in parallel to each of said plurality of said SRAM base blocks.

14. The SRAM cell for implementing a SRAM read PSRO as recited in claim 1 wherein said SRAM read PSRO includes an inverted feedback output; said inverted feedback output is combined with a control signal to stop and start said ring operation.

15. The SRAM cell for implementing a SRAM read PSRO as recited in claim 1 wherein said wherein said SRAM read PSRO includes a plurality of series connected inverters included in a ring output path to expand said pulse width of a ring oscillator output signal.

16. The SRAM cell for implementing a SRAM read PSRO as recited in claim 1 wherein said one side of the static latch being connected to voltage supply enables operation without initialization of said SRAM cell.

17. A method for implementing a static random access memory (SRAM) read performance sort ring oscillator (PSRO) with a SRAM cell including a static latch and a pair of access transistors; said pair of access transistors respectively connected between a true side of the static latch and a true bitline input, and a complement side of the static latch and a complement bitline input; said method comprising the steps of:
   connecting independent left and right wordlines to a respective gate input to said pair of access transistors of said SRAM cell;
   connecting one side of the static latch, where the access transistor is coupled to, of said SRAM cell to voltage supply;
   assembling together a plurality of the SRAM cells for defining a SRAM base block; and
   connecting together a plurality of said SRAM base blocks to form the SRAM read PSRO.

18. The method for implementing a SRAM read PSRO as recited in claim 17 wherein connecting together a plurality of said SRAM base blocks to form the SRAM read PSRO includes connecting said plurality of said SRAM base blocks in a chain.

19. The method for implementing a SRAM read PSRO as recited in claim 18 includes providing a reset signal; and applying said reset signal in parallel to each of said plurality of said SRAM base blocks.

20. The method for implementing a SRAM read PSRO as recited in claim 17 wherein connecting together a plurality of said SRAM base blocks to form the SRAM read PSRO includes combining an inverted feedback output signal of said chain with a control signal to stop and start said ring operation.

* * * * *